(12) United States Patent
Wang et al.

(10) Patent No.: US 9,396,980 B2
(45) Date of Patent: Jul. 19, 2016

(54) ANTI-ELECTROSTATIC SUBSTRATE CASSETTE

(71) Applicant: GUDENG PRECISION INDUSTRIAL CO., LTD., New Taipei (TW)

(72) Inventors: Chien-Feng Wang, New Taipei (TW); Shao-Wei Lu, Taoyuan County (TW); Po-Tin Lee, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 0 days.

(21) Appl. No.: 14/246,337

(22) Filed: Apr. 7, 2014

(65) Prior Publication Data

US 2014/0299508 A1    Oct. 9, 2014

(30) Foreign Application Priority Data

Apr. 9, 2013 (TW) .............................. 102206395 U

(51) Int. Cl.
  *B65D 85/30* (2006.01)
  *H01L 21/673* (2006.01)
(52) U.S. Cl.
  CPC .......... *H01L 21/67396* (2013.01); *B65D 85/30* (2013.01)

(58) Field of Classification Search
  CPC ...... H01L 21/6732; H01L 21/6735–21/67393; H01L 21/67396; H01L 21/673
  USPC .................. 206/454, 710, 711; 211/41.18, 26
  See application file for complete search history.

(56) References Cited

U.S. PATENT DOCUMENTS

| | | | |
|---|---|---|---|
| 6,781,205 B1 * | 8/2004 | Levit et al. ..................... | 206/710 |
| 7,316,325 B2 * | 1/2008 | Burns et al. ................. | 211/41.18 |
| 7,337,911 B2 * | 3/2008 | Wu et al. .......................... | 211/26 |
| 7,347,329 B2 * | 3/2008 | Burns et al. ................... | 206/711 |
| 7,922,000 B2 * | 4/2011 | Hyobu .......................... | 206/454 |
| 8,863,956 B2 * | 10/2014 | Brooks et al. ................. | 206/710 |
| 2008/0110795 A1 * | 5/2008 | Kao et al. ...................... | 206/710 |

* cited by examiner

*Primary Examiner* — Bryon Gehman
(74) *Attorney, Agent, or Firm* — Rosenberg, Klein & Lee

(57) ABSTRACT

The present invention provides an anti-electrostatic cassette, which mainly comprises at least an electrostatic discharge (ESD) device connected electrically to the carrying frames, which are disposed in the substrate cassette and carry the substrates, and to the handles, which are disposed on the outer sides of the substrate cassette, for forming the conductive path. By means of the contact between the equipment and the two handles of the substrate cassette, the residual static charges on the substrates are conducted to the ground for reducing the residual static charges on the substrates. Consequently, the ESD phenomena in the substrates due to friction can be avoided and hence preventing the damages in the substrates caused by static charges.

10 Claims, 7 Drawing Sheets

US 9,396,980 B2

ANTI-ELECTROSTATIC SUBSTRATE CASSETTE

FIELD OF THE INVENTION

The present invention relates generally to a substrate cassette, and particularly to an anti-electrostatic substrate cassette, which can discharge static charges for avoiding electrostatic discharge (ESD) in the substrates due to friction.

BACKGROUND OF THE INVENTION

Currently, during the fabrication process, the delicate and valuable substrates, including wafers for fabricating semiconductor devices, magnetic storage disc substrates, and LCD panel substrates, need to be transported continuously for various process steps. Nonetheless, these kinds of substrates are vulnerable to damages caused by environmental influences such as dust, electrostatic discharge, vibration, and gaseous containment.

Dust and the pollutants in the form of particles coming from the atmosphere will adhere to the substrates and cause irreversible damages. Because the size of integrated circuits is kept shrinking, the size of the particles threatening integrated circuits becomes smaller. Thereby, minimizing the pollutants has become extremely important. In the semiconductor industry, complicated methods, such as clean rooms, are adopted for preventing the environmental influences on the substrates.

As described above, it is required to protect substrate in each step of fabrication. Presently, a substrate cassette is used for accommodating substrate and isolating the substrates from the contact of external environment. Hence, damages on the substrate owing to the influences of the environment can be prevented. The substrate cassette described above includes, for example, the Front Opening Unified Pod system (FOUP). During the transit process of the substrate cassette, it can hold the substrates firmly. Nonetheless, the substrates tend to rub against the substrate cassette and generate particulate pollutants. Thereby, the material of current substrate cassette is an abrasion-resistive plastic material for preventing particulates generation between the substrates and the substrate cassette.

When substrates, including wafers or the substrates for semiconductor devices, are stored in the substrate cassette according to the prior art, vibration occurs and a substantial amount of static charges are generated due to the friction between the substrates and the substrate cassette. The static charges will be remained on the substrates. As the substrates are removed from the substrate cassette, ESD damages occur in the removed substrates because of the friction between the substrates and the substrate cassette. Thereby, it is required to eliminate the residual static charges on the substrates for avoiding electrostatic damages in the substrates.

Accordingly, the present invention provides an anti-electrostatic substrate cassette, which can discharge static charges for avoiding ESD in the substrates due to friction and thus improving the yield of the substrates.

SUMMARY

An objective of the present invention is to provide an anti-electrostatic cassette, which comprises at least an ESD device. The ESD device is connected electrically to the devices contacting the substrates for leading the residual static charges on the substrates to a ground. Thereby, damages due to ESD between the substrates and the substrate cassette can be avoided.

For achieving the objective and effect described above, the present invention discloses an anti-electrostatic substrate cassette, which comprises a case, two carrying frames, two handles, and at least a first ESD device. The case has a left sidewall and a right sidewall. The two carrying frames are disposed on the left and right sidewalls in the case, respectively, and support at least a substrate. The two handles are disposed on the left and tight sidewalls and located outside the case. The first ESD device is embedded on the left or right sidewall and connected electrically to the corresponding carrying frame for forming a first conductive path. The static charges on the substrate are conducted along the first conductive path to a ground.

DETAILED DESCRIPTION

In order to make the structure and characteristics as well as the effectiveness of the present invention to be further understood and recognized, the detailed description of the present invention is provided as follows along with embodiments and accompanying figures.

When substrates, including wafers or the substrates for semiconductor devices, are stored in the substrate cassette according to the prior art, vibration occurs and a substantial amount of static charges are generated due to the friction between the substrates and the substrate cassette. The static charges will be remained on the substrates. As the substrates are removed from the substrate cassette without leading away the residual static charges, ESD damages occur in the removed substrates because of the friction between the substrates and the substrate cassette. Thereby, the present invention provides an anti-electrostatic substrate cassette, which can discharge the residual static charges on the substrates via at least an ESD device for avoiding ESD between the substrates and the substrate cassette and thus preventing electrostatic damages in the substrates.

Figure 1:
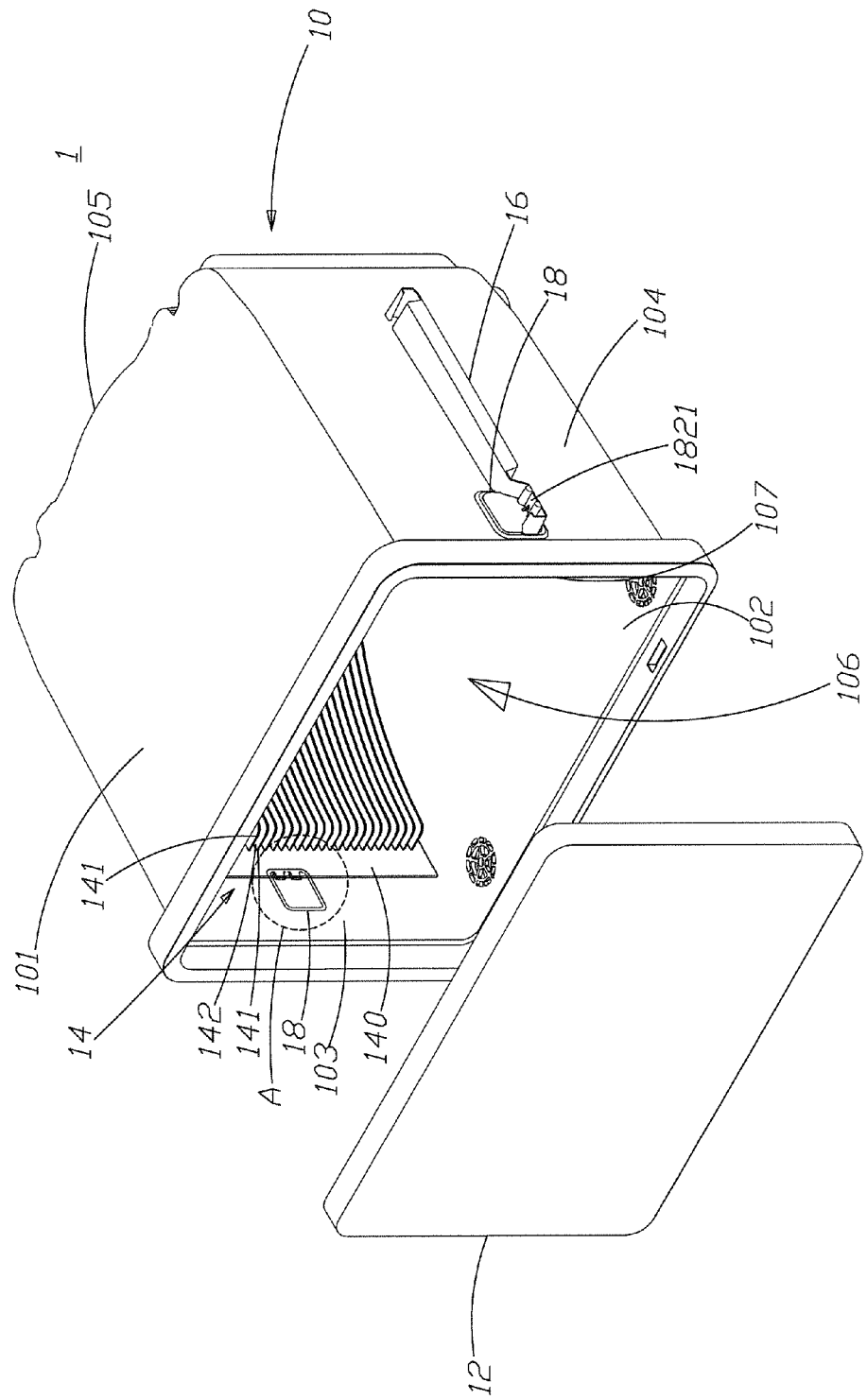
FIG. 1 shows a schematic diagram of the substrate cassette according the first embodiment of the present invention.

FIG. 1 shows a schematic diagram of the substrate cassette according the first embodiment of the present invention. As shown in the figure, the present embodiment provides a substrate cassette 1, which is an FOUP. The substrate cassette 1 comprises a case 10 and a door 12. The case 10 includes a top part 101, a base part 102, a left sidewall 103, a right sidewall 104, and a rear sidewall 105. The left and right sidewalls 103, 104 are disposed on both sides of the rear sidewall 105, respectively, and opposing to each other. The left, right, and rear sidewalls 103, 104, 105 are disposed between the top part 101 and the base part 102, which is opposing to the top part 101, and forming an accommodating space 106 in the case 10. Besides, the top part 101, the left sidewall 103, the base part 102, and the right sidewall 104 surround and forming an opening 107 communicating with the accommodating space 106. The door 12 is used for sealing the opening 107 of the case 10 and making the accommodating space 106 airtight. At least a substrate, such as a wafer, is stored in the accommodating space 106 for transportation. The materials of the case 10 and the door 12 described above are insulating materials, and hence making the case 10 and the door 12 insulators.

The substrate cassette 1 according to the present embodiment further comprises two carrying frames 14 disposed on the left and right sidewalls 103, 104 of the case 10, respectively, and opposing to each other. Each carrying frame 14 has a main body 140 and a plurality of supporting ribs 141. The plurality of supporting ribs 141 are spaced at intervals on the main body 140 and thus forming a plurality of carrying grooves 142 therebetween. The plurality of carrying grooves 142 of the carrying frame 14 on the left sidewall 103 correspond to the plurality of carrying grooves 142 of the carrying frame 14 on the right sidewall 104. The substrates are disposed in the corresponding plurality of carrying grooves 142 and contact the supporting ribs 141 adjacent to the carrying grooves 142. The supporting ribs 141 support the substrates and thereby the substrates are disposed horizontally in the accommodating space 106 of the case 10. In addition, the substrate cassette 1 further comprises two handles 16 disposed on the outer surfaces of the left and right sidewalls 103, 104, respectively, and opposing to each other. The two handles 16 of the substrate cassette 1 are used for disposing a piece of equipment, for example, transit equipment. The manipulator or the carrying frame of the equipment clips or carries the two handles 16 for lifting and moving the substrate cassette 1.

Figure 2A:
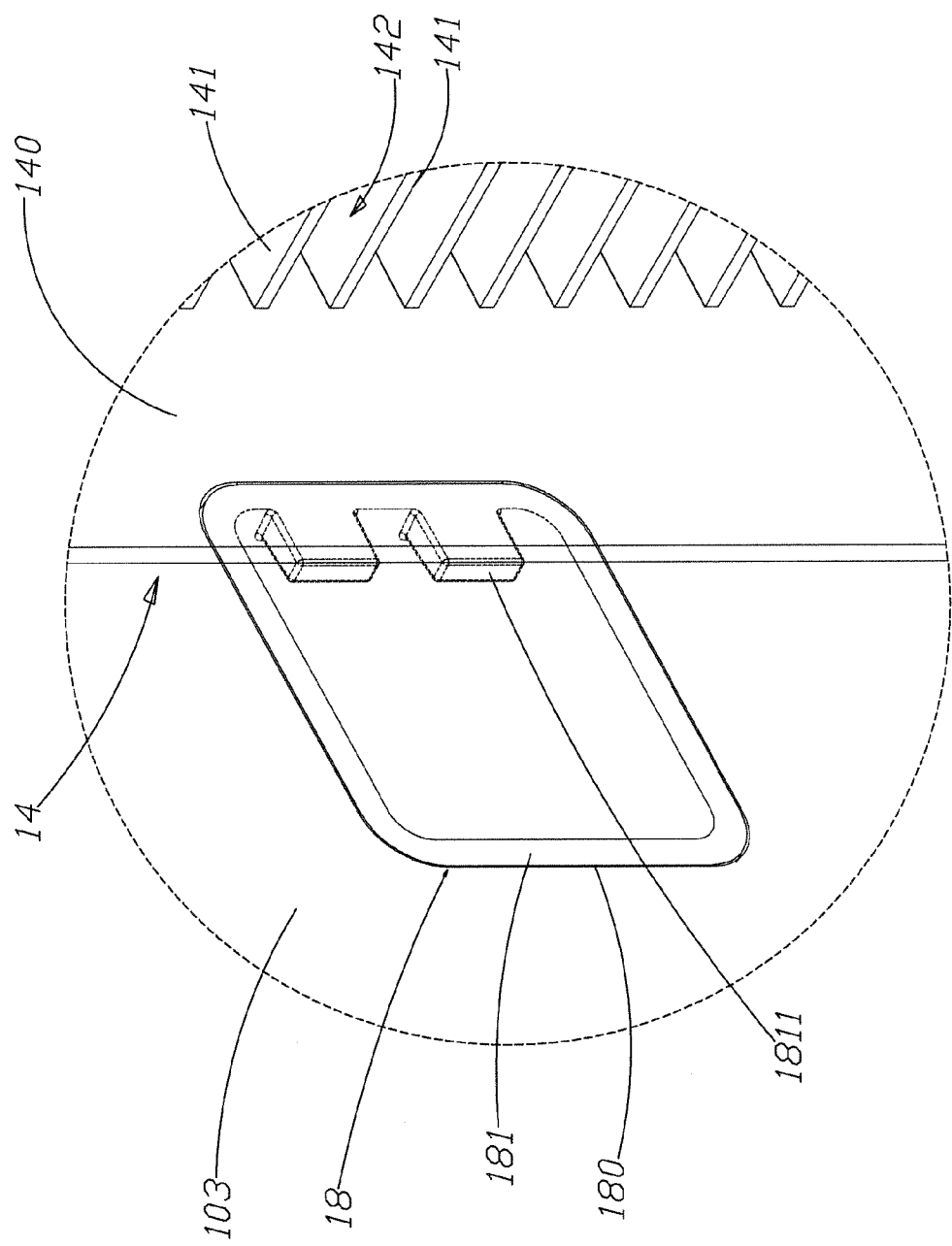
FIG. 2A shows an enlarged view of the zone A in FIG. 1 according to the present invention.
Figure 2B:
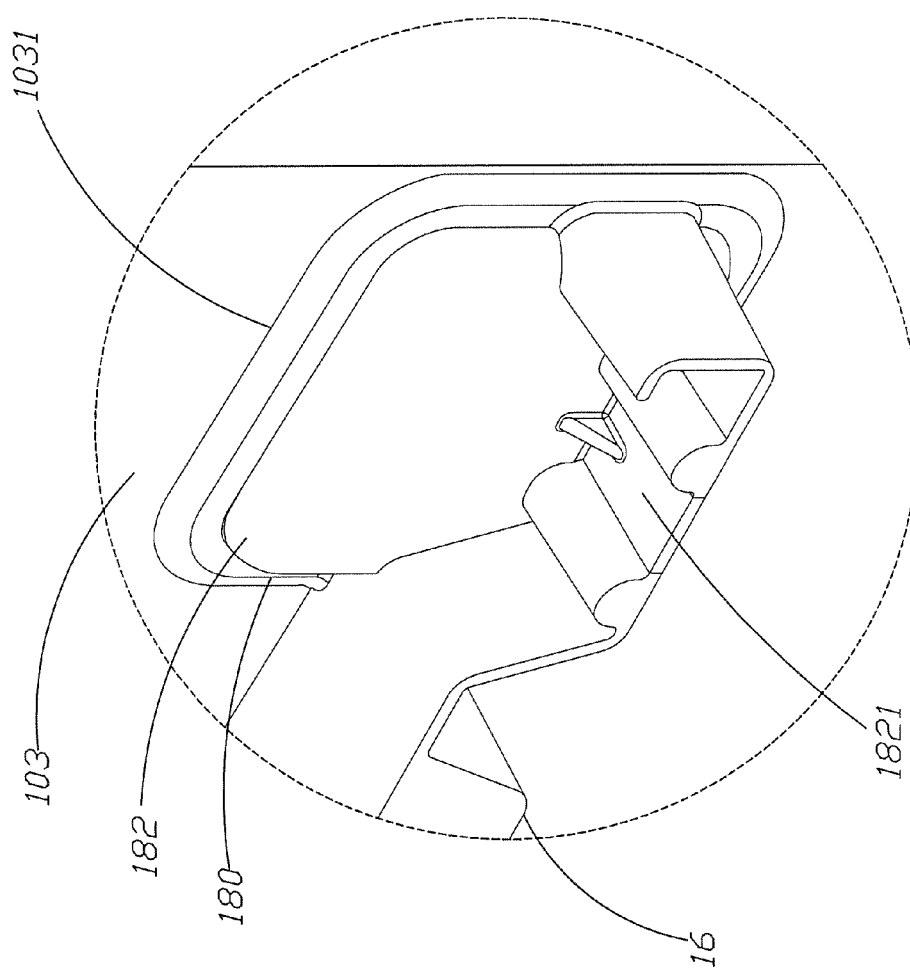
FIG. 2B shows another enlarged view of the zone A in FIG. 1 according to the present invention.

As the substrates are loaded in the substrate cassette 1 and transited to the next process step, vibration occurs on the substrate cassette 1 during the transit process. The substrates rub against the supporting ribs 141 of the carrying frames 14 and the sidewalls or door 12 of the case 10. Thereby, the substrates carry a substantial amount of static charges. For preventing ESD due to the friction, it is required to reduce the amount of the residual static charges on the substrates. Accordingly, the substrate cassette 1 according to the present embodiment further comprises two first ED devices 18. Please refer to FIGS. 2A and 2B. The two first ESD devices 18 are embedded in the left and right sidewalls 103, 104, respectively, and connected electrically with the corresponding carrying frames 14, respectively. Thereby, the static charges on the substrates are led to a ground via the carrying frames 14 and the first ESD devices 18 and thus reducing the residual static charges on the substrates. Consequently, the ESD phenomena between the substrates and the case 10 can be avoided.

Figure 3:
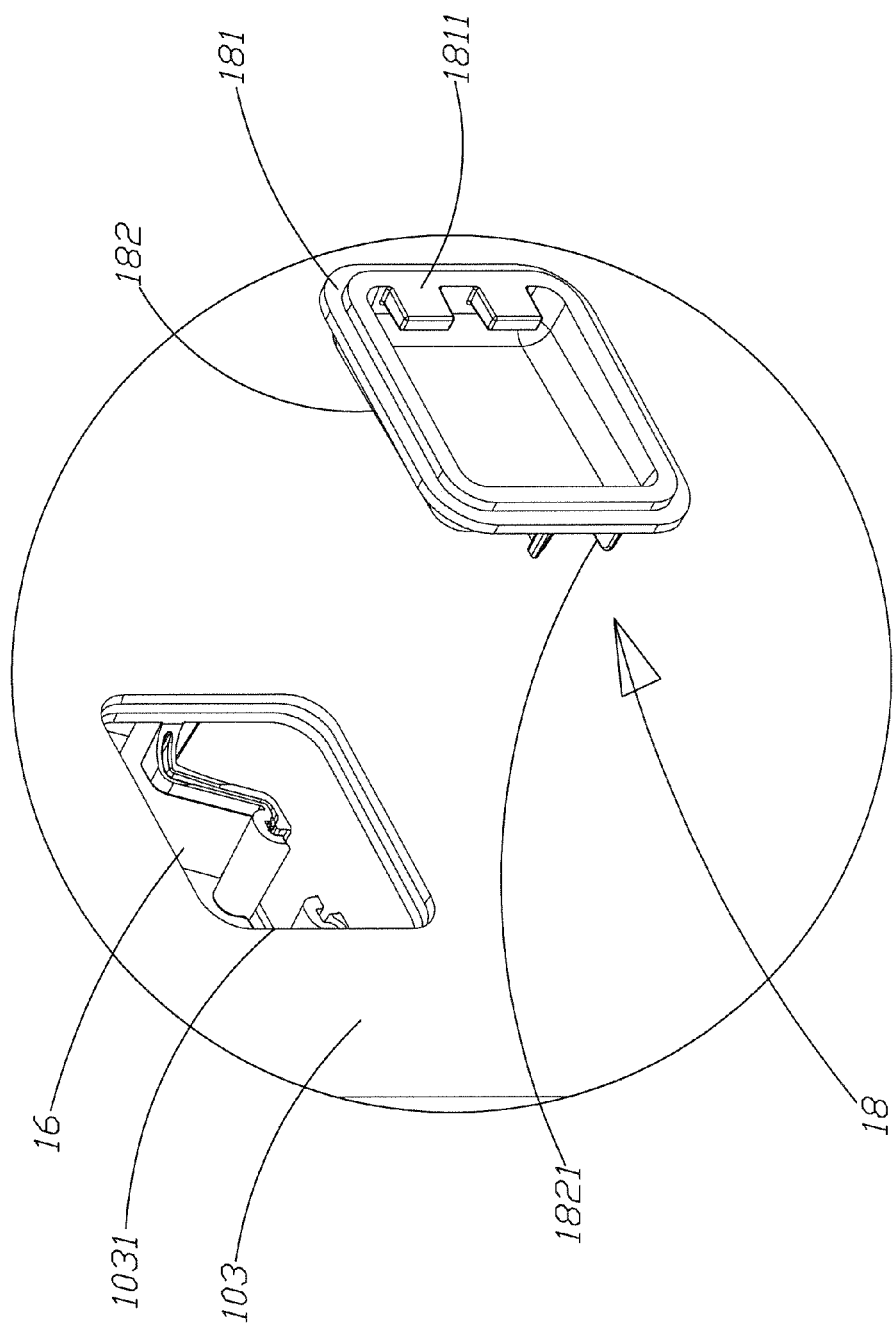
FIG. 3 shows a schematic diagram of the first ESD device assembled in the case according to the first embodiment of the present invention.

FIG. 3 shows a schematic diagram of the first ESD device assembled in the case according to the first embodiment of the present invention. As shown in the figure, because the structures of the two first ESD devices 18 are identical, the one disposed on the left sidewall 103 will be used for detailed description. The left sidewall 103 according to the present embodiment has a first installation part 1031. According to the present embodiment, the first installation part 1031 is a hole penetrating the left sidewall 103. Besides, the first ESD device 18 has a first main body 180 embedded in the first installation part 1031. The first main body 180 has a first surface 181 and a second surface 182 opposing to the first surface 181. The first surface 181 is exposed to the inner surface of the left sidewall 103 and facing the accommodating space 106 of the case 10. The second surface 182 is exposed to the outer surface of the left sidewall 103 and facing the exterior of the case 10. Moreover, the first surface 181 has at least a first electrical connecting part 1811 contacting the carrying frame 14 disposed on the left sidewall 103. The second surface 182 has at least a second electrical connecting part 1821 projecting the left sidewall 103 and embedded in the handle 16 on the left sidewall 103. The second electrical connecting part 1821 is exposed to the surface of the handle 16. The first installation part 1031 being a hole is only an embodiment of the present invention; the first installation part 1031 can be of another type once the first electrical connecting part 1811 of the first ESD device 18 contacts the carrying frame 14 and the second electrical connecting part 1821 is exposed to the surfaces of the left sidewall 103 and the handle 16. The details will be described further.

Figure 4:
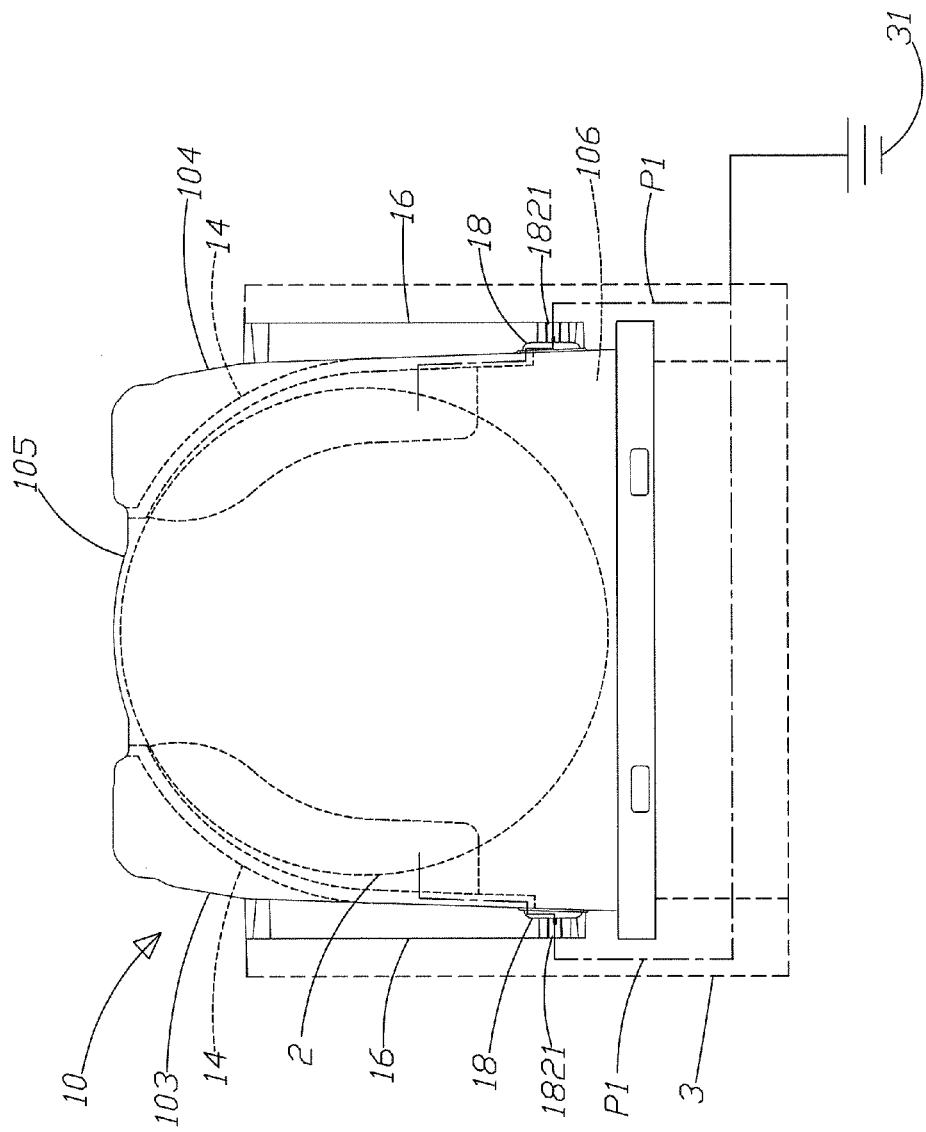
FIG. 4 shows a usage status diagram of the substrate cassette according the first embodiment of the present invention.

FIG. 4 shows a usage status diagram of the substrate cassette according the first embodiment of the present invention. As shown in the figure, for connecting electrically the carrying frames 14 and the first ESD devices 18, the carrying frames 14 and the first ESD devices 18 contain conductive materials, which make the carrying frames 14 and the first ESD devices 18 conductors. Thereby, the carrying frames 14 and the first ESD devices 18 form a first conductive path P1. The static charges of the substrates 2 can be conducted to the ground 31 along the first conductive path P1. The conductive materials described above can be carbon blackpowders, carbon fibers, metal fibers, metal-plated carbon fibers, or metal powders.

The ground 31 described above is the ground 31 of a piece of equipment 3. Furthermore, the two handles 16 of the substrate cassette 1 according to the present embodiment are disposed on the manipulator or carrying frame of the equipment 3. Thereby, the manipulator or carrying frame of the equipment 3 can contact the second electrical connecting parts 1821 of the first ESD devices 18. The first conductive path P1 formed by the carrying frames 14 and the first ESD devices 18 is mainly connected electrically with the ground 31 of the equipment 3. Then, the static charges of the substrates 2 are conducted to the ground 31 following the first conductive path P1, reducing effectively the residual static charges on the substrates 2. Accordingly, the ESD phenomena between the substrates 2 and the case 10, the door 12, and the two carrying frames 14 due to friction can be avoided, which further reduces the damage rate of the substrates 2.

Figure 5:
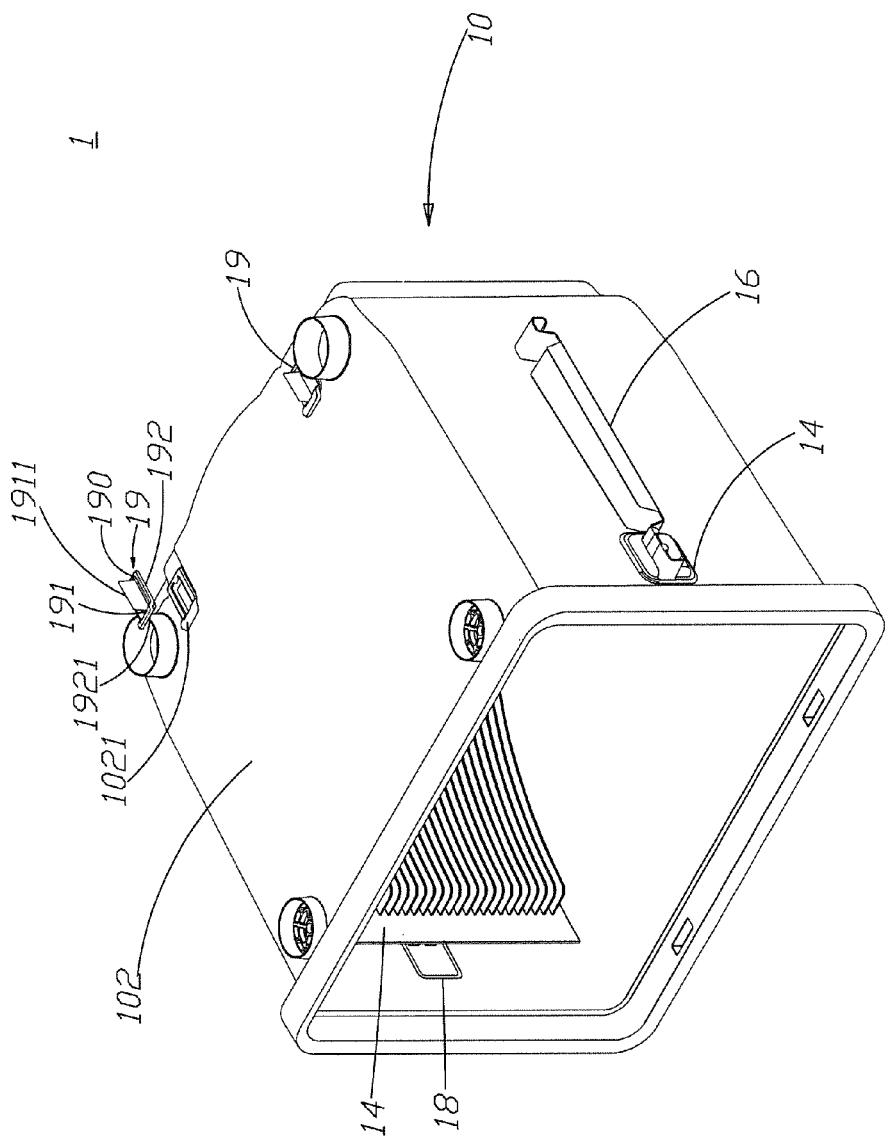
FIG. 5 shows a schematic diagram of the second ESD device assembled in the case according to the second embodiment of the present invention.
Figure 6:
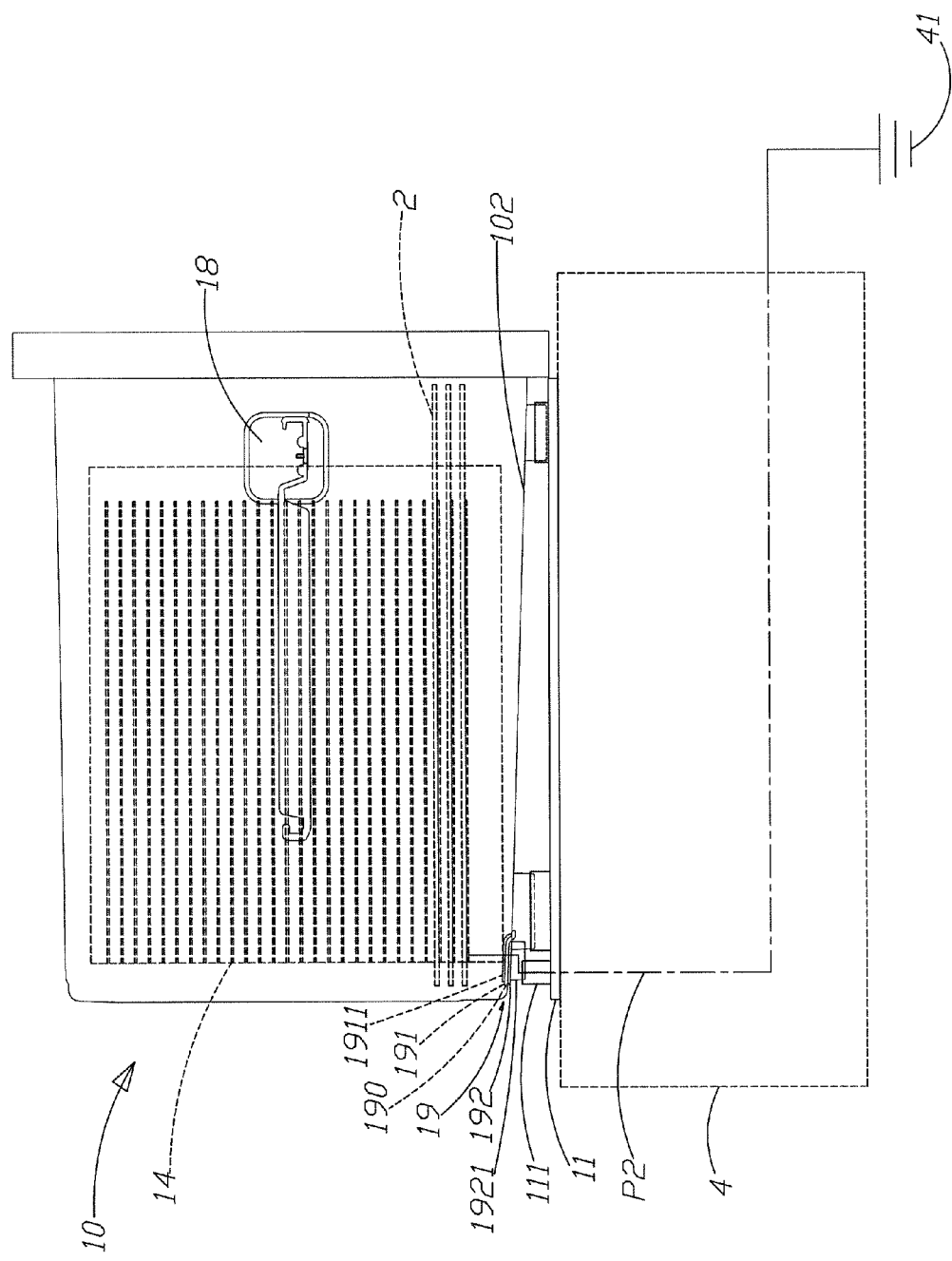
FIG. 6 shows a usage status diagram of the substrate cassette according the second embodiment of the present invention.

FIG. 5 shows a schematic diagram of the second ESD device assembled in the case according to the second embodiment of the present invention; and FIG. 6 shows a usage status diagram of the substrate cassette according the second embodiment of the present invention. As shown in the figures, for reducing the residual static charges on the substrates 2 rapidly, the substrate cassette 1 further comprises two second ESD devices 19 embedded on the base part 102 and connected electrically to the corresponding carrying frames, respectively, and a base plate 11 disposed at the base part 102. Thereby, the carrying frames 14, the second ESD devices 19, and the base plate 11 form a second conductive path P2. The residual static charges on the substrates 2 can be discharged along the second conductive path P2 as well.

The base part 102 of the substrate cassette 1 described above has two second installation parts 1021. According to the present embodiment, the second installation part 1021 is also a hole penetrating the base part 102. The second ESD devices 19 disposed on the second installation part 1021 has a second main body 190 embedded in the second installation part 1021. The second main body 190 has a first surface 191 and a second surface 192 opposing to the first surface 191. The first surface 191 of the second main body 190 faces the accommodating space 106 and has at least a first electrical connecting part 1911 contacting the corresponding carrying frame 14. The second surface 192 of the second main body 190 faces the exterior of the substrate cassette 1 and has at least a second electrical connecting part 1921 contacting the base plate 11. Besides, the two carrying frames 14, the two second ESD devices 19, and the base plate 11 contain conductive materials, and thus making the two carrying frames 14, the two second ESD devices 19, and the base plate 11 conductors, respectively. Consequently, the first and second electrical connecting parts 1911, 1921 of the second ESD devices 19 can be connected electrically to the carrying frames 14 and the base plate 11 for forming the second conductive path P2.

When the substrate cassette 1 is disposed in a piece of equipment 4, such as aeration equipment, connecting with the base plate 11, the second conductive path P2 formed by the carrying frames 14, the second ESD devices 19, and the base plate 11 is connected electrically with the ground 41 of the equipment 4. Thereby, the residual static charges on the substrates 2 are conducted to the ground 41 of the equipment 4, which reduces the amount of the static charges on the substrates 2, and prevents effectively ESD between the substrates 2 and the case 10, the door 12, and the two carrying frames 14 due to friction as well as damages in the substrates 2. The first and second ESD devices 18, 19 can accelerate discharging of static charges on the substrate 2. Nonetheless, the equipment 4 according to present embodiment can be the same as the equipment 3 according to the first embodiment. The details will not be repeated again.

To sum up, the present invention provides an anti-electrostatic cassette, which mainly comprises at least an ESD device connected electrically to the carrying frames, which are disposed in the substrate cassette and carry the substrates, and to the handles, which are disposed on the outer sides of the substrate cassette, for forming the conductive path. By means of the contact between the equipment and the two handles of the substrate cassette, the conductive path is connected electrically with the ground of the equipment. Thereby, the residual static charges on the substrates are conducted to the ground of the equipment via the conductive path for reducing the residual static charges on the substrates. Consequently, the ESD phenomena in the substrates due to friction can be avoided and hence preventing the damages in the substrates caused by static charges.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An anti-electrostatic substrate cassette, comprising:
a case, having a left sidewall and a right sidewall;
two carrying frames, disposed on said left sidewall and said right sidewall, respectively, located in said case, and supporting at least a substrate;
two handles, disposed on said left sidewall and said right sidewall, respectively, and located outside said case; and
at least a first electrostatic discharge device, embedded in said left sidewall or said right sidewall and exposed to one of said handles, contacting and connected directly with one of said carrying frames, for forming a first conductive path, and the static charges of said substrate conducted to a ground along said first conductive path.

2. The anti-electrostatic substrate cassette of claim 1, wherein said carrying frames and said first electrostatic discharge device are conductors.

3. The anti-electrostatic substrate cassette of claim 1, wherein said first electrostatic discharge device is embedded in a first installation part, wherein said first installation part is a hole penetrating said left sidewall or said right sidewall.

4. The anti-electrostatic substrate cassette of claim 3, wherein said first electrostatic device comprises:
a first main body, embedded in said first installation part, having a first surface, and having a second surface opposing to said first surface;
at least a first electrical connecting part, disposed on said first surface, and connected directly with said corresponding carrying frame; and
at least a second electrical connecting part, disposed on said second surface, projected from one of said left sidewall and said right sidewall.

5. The anti-electrostatic substrate cassette of claim 1, wherein said ground is a ground of a piece of equipment; said piece of equipment contacts said first electrostatic discharge device; and said first conductive path is connected electrically to said ground.

6. The anti-electrostatic substrate cassette of claim 1, and further comprising:
a base plate, disposed at a base part of said case, and located outside said case; and
at least a second electrostatic discharge device, embedded in said base part, connected directly with one of said carrying frames and said base plate for forming a second conductive path, and the static charges of said substrate conducted to said ground along said second conductive path.

7. The anti-electrostatic substrate cassette of claim 6, wherein said second electrostatic device and said base plate are conductors.

8. The anti-electrostatic substrate cassette of claim 6, wherein said second electrostatic device is embedded in a second installation part of said base part.

9. The anti-electrostatic substrate cassette of claim 8, wherein said second electrostatic device comprises:
a second main body, embedded in said second installation part, having a first surface, and having a second surface opposing to said first surface;
at least a first electrical connecting part, disposed on said first surface, and connected electrically with said one of said carrying frames; and
at least a second electrical connecting part, disposed on said second surface, and connected with said base plate.

10. The anti-electrostatic substrate cassette of claim 6, wherein said ground is a ground of a piece of equipment; said piece of equipment contacts said first electrostatic discharge device and said base plate; and said first conductive path and said second conductive path are connected electrically to said ground.

* * * * *